United States Patent
Riegler et al.

(10) Patent No.: US 8,008,916 B2
(45) Date of Patent: Aug. 30, 2011

(54) MAGNETIC RESONANCE APPARATUS HAVING AN ASYMMETRICAL CYLINDRICAL GRADIENT COIL AND AT LEAST ONE ASYMMETRICAL SHIM-COIL

(75) Inventors: Jörg Riegler, Fürth (DE); Axel vom Endt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 625 days.

(21) Appl. No.: 11/995,953

(22) PCT Filed: Jul. 14, 2006

(86) PCT No.: PCT/EP2006/064282
§ 371 (c)(1),
(2), (4) Date: Jan. 17, 2008

(87) PCT Pub. No.: WO2007/009956
PCT Pub. Date: Jan. 25, 2007

(65) Prior Publication Data
US 2010/0117648 A1    May 13, 2010

(30) Foreign Application Priority Data

Jul. 20, 2005  (DE) .......................... 10 2005 033 955

(51) Int. Cl.
*G01V 3/00* (2006.01)
*A61B 5/05* (2006.01)
(52) U.S. Cl. ........ 324/318; 324/319; 324/320; 600/410; 600/411; 600/422
(58) Field of Classification Search .......... 324/300–322; 600/410, 411, 422; 333/219–235; 382/128–131
See application file for complete search history.

(56) References Cited

U.S. PATENT DOCUMENTS

| | | | |
|---|---|---|---|
| 4,906,934 A | 3/1990 | Haragashira | 324/319 |
| 5,111,147 A | 5/1992 | Aubert | 324/318 |
| 5,530,355 A * | 6/1996 | Doty | 324/318 |
| 5,708,360 A | 1/1998 | Yui et al. | 324/318 |
| 5,793,209 A | 8/1998 | Kondo et al. | 324/318 |
| 6,351,123 B1 | 2/2002 | Gebhardt | 324/318 |
| 6,664,879 B2 | 12/2003 | Forbes et al. | 335/301 |

(Continued)

FOREIGN PATENT DOCUMENTS

EP    0 132 338    1/1985

(Continued)

OTHER PUBLICATIONS

Patent Abstracts of Japan Publication No. 01284239.

(Continued)

*Primary Examiner* — Melissa J Koval
*Assistant Examiner* — Tiffany A Fetzner
(74) *Attorney, Agent, or Firm* — Schiff Hardin LLP

(57) ABSTRACT

A magnetic resonance apparatus has a cylindrical gradient coil with an x-gradient coil and a y-gradient coil that are asymmetrical relative to the z-direction of a coordinate system, the z-direction extending along a longitudinal direction of a patient receptacle. Shim coils are provided that generate magnetic fields to homogenize the basic magnetic field, produced by a cylindrical basic field magnet, in an examination volume in the patient receptacle. At least some of the shim coils are asymmetrical relative to the z-direction to minimize coupling induction between the asymmetrical x-gradient coil and y-gradient coil and the asymmetrical shim coils.

7 Claims, 4 Drawing Sheets

U.S. PATENT DOCUMENTS

| | | | |
|---|---|---|---|
| 6,788,057 B1 * | 9/2004 | Petropoulos et al. | 324/318 |
| 6,844,731 B2 | 1/2005 | Endt | 324/318 |
| 2005/0146330 A1 * | 7/2005 | Teklemariam et al. | 324/318 |
| 2010/0117648 A1 * | 5/2010 | Riegler et al. | 324/318 |

FOREIGN PATENT DOCUMENTS

| | | |
|---|---|---|
| EP | 0 547 917 | 6/1993 |
| GB | 2 406 652 | 12/2004 |
| WO | WO 03/052443 | 6/2003 |

OTHER PUBLICATIONS

Patent Abstracts of Japan Publication No. 60157206.

"A High-Performance Head Gradient Coil for 7T Systems," vom Endt et al, Proc. Intl. Soc. Mag. Reson. Med., vol. 14 (2006) p. 1370.

"Torque Compensated Asymmetric Gradient Coils for EPI," Abduljalil et al. 12th Annual Meeting of SMRM, vol. 3 (1993), p. 1306.

"Bildgebende Systeme für die medizinische Diagnostik," Krestel (1988) pp. 480-481 and 496-499.

* cited by examiner

MAGNETIC RESONANCE APPARATUS HAVING AN ASYMMETRICAL CYLINDRICAL GRADIENT COIL AND AT LEAST ONE ASYMMETRICAL SHIM-COIL

BACKGROUND OF THE INVENTION

1. Field of the Invention

The invention concerns an magnetic resonance apparatus of the type having a cylindrical gradient coil with x- and y-coils directed asymmetrically relative to a z-direction (running along a patient receptacle) of a shim coils for generation of magnetic fields serving for the homogenization coordinate system, as well as a number of a basic magnetic field generated by means of a cylindrical basic field magnet.

2. Description of the Prior Art

A magnetic resonance apparatus serves for the high-resolution acquisition of images of an examination subject using magnetic fields. Various magnetic fields are generated for this purpose. A static basic magnetic field is generated using a (normally cylindrical) basic field magnet, whereby the field strength normally being between 0.2 and 10 T. Furthermore, a radio-frequency excitation field ($B_1$ field) for excitation of the nuclear spins is generated using a radio-frequency coil. For spatial resolution a gradient field with three separate field components in the three spatial axes is also generated using a gradient coil. Because the basic magnetic field is not entirely homogeneous, but rather exhibits or is subject to disruptions, shim coils are also used that respectively generate correction magnetic fields with which the homogeneity of the basic magnetic field is adjusted. Typically five shim coils are used that respectively generate a magnetic field that corresponds to a specific term of a spherical function expansion of the second order of the basic magnetic field. These five terms or field terms are typically explicitly determined by a magnetic field measurement so that each shim coil can be correspondingly adjusted so the shim magnetic field generated by each shim coil corrects the respective term-related inhomogeneity.

The gradient coils (thus the x-coil, y-coil and z-coil) are typically arranged or wound or directed symmetrically around the periphery and symmetrically in the z-direction. To avoid couplings between the shim coils and the gradient coils due to the respectively generated fields, the respective shim coils are also formed symmetrically. Given special gradient coils (for example for head imaging), the symmetry of the x- and y-gradient coils relative to the z-direction is destroyed due to the specific shaping of such gradient coils that, with regard to the patient body to be acquired, exhibit frontal broadenings or recesses. This means that the x- and y-gradient coils are directed asymmetrically relative to the z-direction. However, as before the associated shim coils are executed symmetrically, which (as it now turns out) leads to considerable coupling inductances of up to approximately 40 μH. Given a slew rate of, for example, 4 MA/s, this coupling inductance leads to an induced voltage of approximately 160 V in the coupled shim coil, meaning that a considerable alternating voltage is injected (induced) into the shim coil. This represents a significant load for the shim amplifier, which must still deliver the constant shim current in a stable manner for the respective coil while this injected alternating voltage is present.

SUMMARY OF THE INVENTION

An object of the invention is to provide a magnetic resonance apparatus that is improved relative to the above-discussed problem.

This object is achieved by a magnetic resonance apparatus of the aforementioned type wherein, in accordance with the invention, at least one part of the shim coils is asymmetrical relative to the z-direction, such that the coupling inductance between the asymmetrical x- and y-coils and the asymmetrical shim coils is minimized.

Departing from known gradient coils, an asymmetry is provided both on the part of the gradient coils and also at least one part of the shim coils, primarily those that can couple with an asymmetrical gradient coil. According to the invention, the symmetry of the shim coils relative to the z-direction is thus also destroyed. The direction of the coil conductor is not arbitrarily asymmetrical; rather, the coil conductor is directed such that the coupling to the shim coils that would have been possible due to the asymmetry of the x- and y-gradient coils is minimized. The design of the shim coils is thus oriented on the design of the asymmetrical gradient coils such that a minimized coupling inductance results, so that possible voltages induced due to a residual coupling are largely negligible but in any case represent no load for the shim amplifier. Because the geometry of the asymmetrical x- and y-gradient coils is known and because the geometry of the available space within which the shim coil is directed is known, the optimal coil conductor direction can be determined using the gradient coil geometry and structural space geometry. The asymmetrical design also offers more freedom in the selection of the conductor positions, such that it is possible to minimize the coupling inductance between gradient coil and shim coil without having to accept curtailments in the precision of the field curve.

In the magnetic resonance apparatus described above the symmetry of the gradient coil is destroyed only in the z-direction, meaning that the x- and y-coils are directed asymmetrically only relative to the z-direction. By contrast, the symmetry relative to the x-direction and y-direction (thus in the peripheral direction) is maintained. This leads to the situation that in operation only the x-gradient coil can couple with the A(2,1)-shim coil and only the y-gradient coil can couple with the B(2,1)-shim coil due to this asymmetry. Other couplings are not possible due to the peripheral geometry as provided before. For this reason it is appropriate but also sufficient when only the two shim coils that generate the magnetic fields corresponding to the A(2,1)-field term and the B(2,1)-field term of a spherical function expansion of the second order are directed asymmetrically. A spherical function expansion serves to describe the magnetic field generated in the patient receptacle. Only the $B_z$ component in the three spatial directions is to be attended to for the field generation or, respectively, compensation. This can be presented as follows in the spherical function expansion:

$$B_z(r, \theta, \varphi) = \sum_{\substack{n=0,\infty \\ m=0,n}} a_{n,m} A_{n,m}(r, \theta, \varphi) + \sum_{\substack{n=1,\infty \\ m=0,n}} b_{n,m} B_{n,m}(r, \theta, \varphi)$$

wherein r, θ, φ define the spatial directions and a, b are expansion coefficients. A and B represent the respective field terms that are generated via the respective associated shim coil.

According to the invention, as stated the A(2,1)-shim coil is asymmetrical on the one hand; with regard to the above spherical function expansion, here n=2 (second order) and m=1 would be the case. The same correspondingly applies with regard to the second shim coil, namely the B(2,1)-shim coil; here as well n=2 and m=1. The spherical function expansion as well as the association of the shim coils with the respective terms and their respectively generated magnetic fields are sufficiently known to those skilled in the art; a more detailed explanation in this regard is not necessary. However, it is important that according to the invention only the shim coils that can couple at all given symmetry destroyed in the z-direction (namely the two aforementioned shim coils) are asymmetrically directed. If the peripheral symmetry is retained, it leads to no further couplings with gradient coils.

The arrangement of the shim coils can, for example, be directly at the basic field magnet or on the inner wall of the cylindrical magnet bore or a comparable point, thus external to the gradient coil. Alternatively and (according to the invention) preferably, it is also possible to arrange the shim coils on the gradient coil between the x-, y- and z-coils and shielding coils (serving for the shielding of the x-, y- and z-coils) lying radially further outward. In addition to the actual field-generating x-, y- and z-coils (which are called the primary coils), a gradient coil possesses what are known as shielding or secondary coils that, viewed radially, are arranged further outward and at a distance from the primary coils. These serve for the external shielding of the gradient field. A radial spacing is required since it must be avoided that the shielding field in any way acts on the gradient field generated by the primary coils and influences this field. It is now appropriate for this given structural space to be used for integration of the shim coils, thus both the (as before) symmetrical shim coils and the asymmetrical shim coils. It is preferable when, as viewed radially, the shim coils are arranged closer (preferably immediately following) the x-, y- and z-coils; the shim coils are thus arranged optimally close to the center of the patient receptacle, and thus lie optimally close to the homogeneity field or imaging volume, and thus exhibit a greater sensitivity.

In addition to the magnetic resonance apparatus, the invention also concerns a cylindrical gradient coil for a magnetic resonance apparatus as described above, having x-, y- and z-coils (wherein the x- and y-coils are directed asymmetrically relative to the z-direction (running along the patient receptacle) of a superordinate coordinate system) as well as a number of shim coils that are arranged between the x-, y- and z-coils and shielding coils (serving for the shielding of the x-, y- and z-coils) lying radially further outward. In this cylindrical gradient coil, which can be an integrated component of a magnetic resonance apparatus or can be inserted therein, at least one part of the shim coils is directed asymmetrically relative to the z-direction, such that the coupling inductance between the asymmetrical x- and y-coils and the asymmetrical shim coils is minimized. Further advantageous embodiments of the inventive gradient coil result from the dependent sub-claims.

DESCRIPTION OF THE PREFERRED EMBODIMENTS

Figure 1:
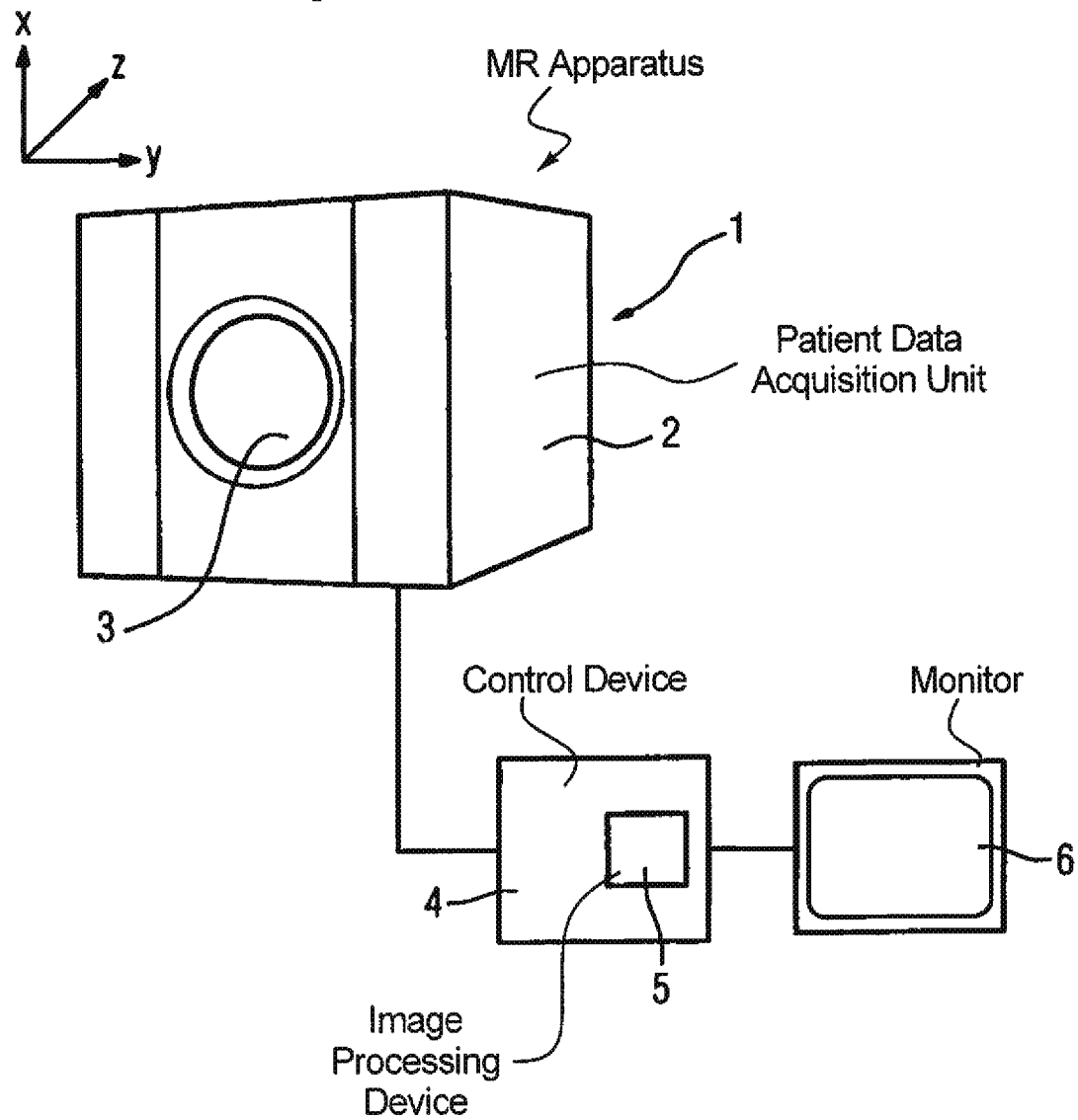
FIG. 1 schematically illustrates the basic components of a magnetic resonance apparatus.

FIG. 1 shows the basic components of an inventive magnetic resonance apparatus 1 that includes a patient data acquisition unit 2, having a gradient coil 3 with which (controlled by a control device 4) a gradient field is generated that serves in a known manner for the spatial resolution of the acquired measurement signals. The control device 4 includes an image processing device 5 that, using the acquired measurement signals, generates magnetic resonance images that can be output to a monitor 6. The fundamental design and the functions and mode of operation of a magnetic resonance apparatus are sufficiently known to those skilled in the art so as to need no further explanation.

Figure 2:
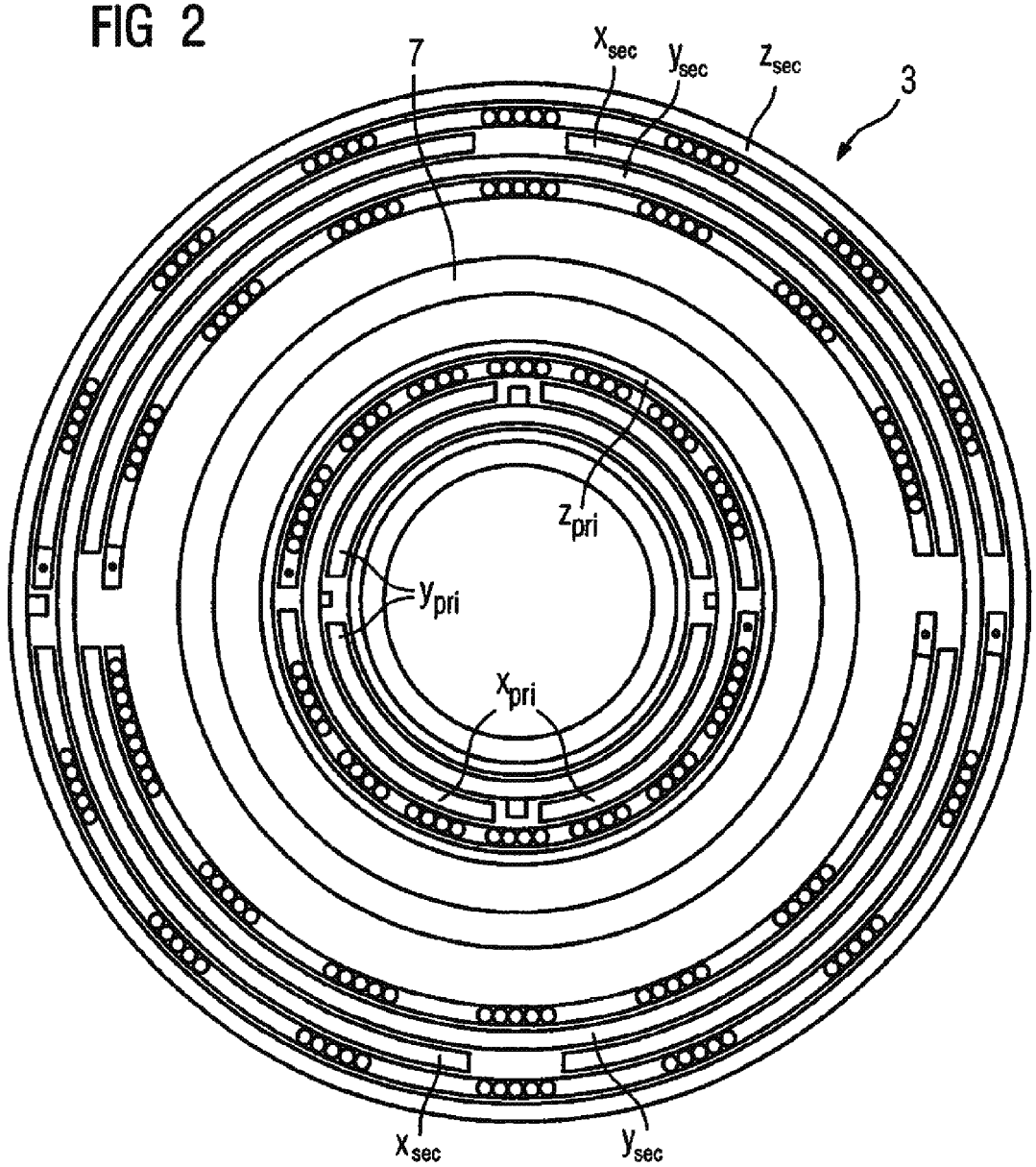
FIG. 2 is a section through a gradient coil in accordance with the present invention.

FIG. 2 shows a section view of a gradient coil 3 that is cylindrical and tube-shaped. This has three individual coils, namely the x-coil, the y-coil and the z-coil situated furthest outwardly as viewed radially. The x-coil and the z-coil are each formed by two coil halves. The coil conductors are applied in a known manner on half-shell-shaped carriers that are arranged opposite one another at the same radius. The z-coil is cylindrically wound running in the z-direction around the coil interconnect. The arrangement of these coils, also called primary coils, is fundamentally known. In FIG. 2 the x-, y- and z-coils are identified with $x_{pri}$, $y_{pri}$ and $z_{pri}$.

Arranged lying further outwardly are shim coils 7 that are not shown in detail in FIG. 2. The shim coils that serve for the generation of fields homogenizing the imaging magnetic field volume are arranged as known on corresponding half-shell-shaped carriers. Normally five shim coils are provided that generate fields corresponding to the five field terms of a spherical function expansion of the second order.

Also shown are the shielding coils or secondary coils situated furthest outward radially that serve for the external shielding of the fields generated via the primary coils. These shielding coils (identified in FIG. 2 with $x_{sec}$, $y_{sec}$ and $z_{sec}$) are, like the primary coils, also executed corresponding to the fundamental design. The secondary x- and y-coils are likewise arranged on corresponding half-shell-shaped carriers while the shielding z-coil is in turn wound around the coil interconnect. The fundamental design of such a gradient coil is sufficiently known and does not have to be explained in detail.

However, what is different than given previous known gradient coils is that in the inventive gradient coil the winding or conductor symmetry in the z-direction is annihilated. The z-direction runs axially through the cylindrical gradient coil 3 (see FIG. 1).

Figure 3:
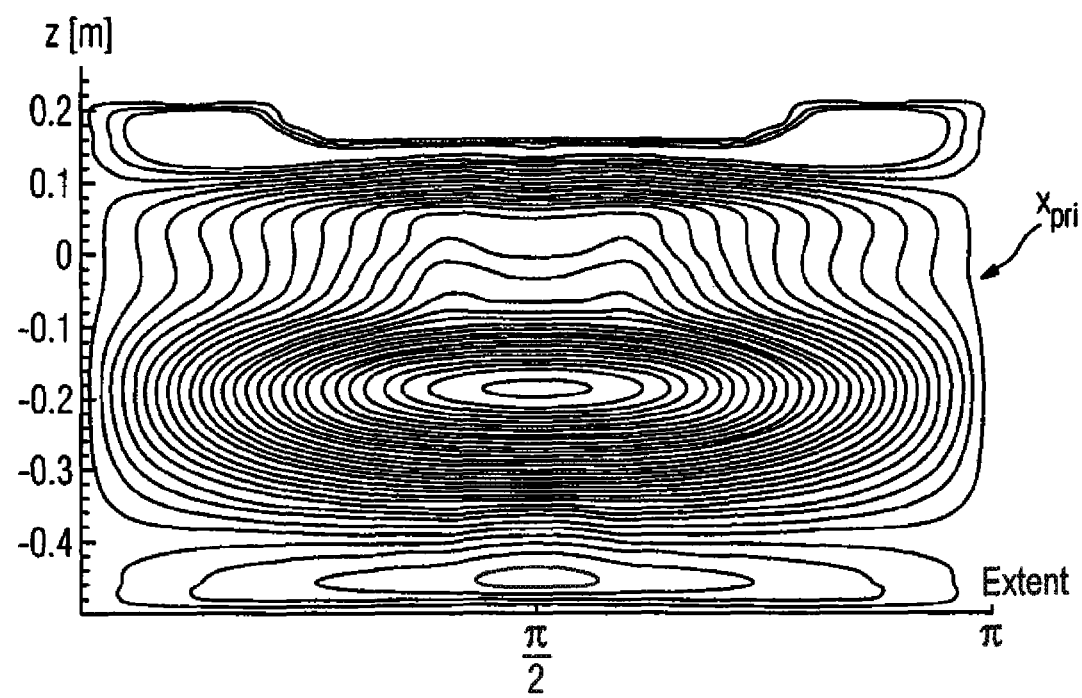
FIG. 3 schematically illustrates an x-gradient coil in accordance with the present invention in a two-dimensional unwound representation.
Figure 6:
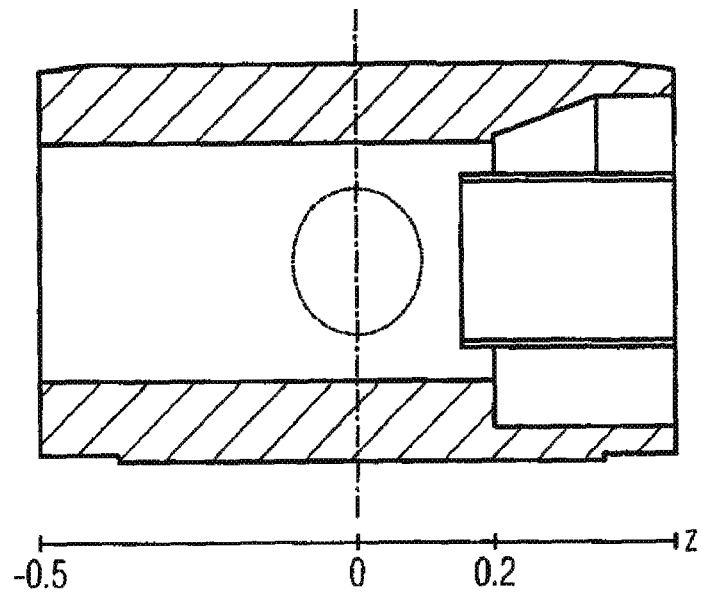
FIG. 6 is a section through a head gradient coil in accordance with the invention, with broadened edges.

FIG. 3 shows an example for an asymmetrical x-coil. The angle from 0-π is plotted along the abscissa (as stated, two such half-shells yield a total coil that runs 360° around the center) and the z-direction is plotted along the ordinate. In the shown example, the gradient coil would be around 65 cm long; it is thus, for example, a separate gradient coil that can be inserted into the magnetic resonance apparatus from FIG. 1, as it is shown in FIG. 6. This gradient coil (which, for example, serves for head acquisitions) is not symmetrical in the z-directed because corresponding recesses or cavities must be provided for acquisition of the shoulder region. The purpose of such coils is to relatively closely enclose the head of the patient in order to be able to acquire optimal images. The shoulder parts (which do not allow a close enclosure) are, as stated, taken into account via the corresponding shaping of the coil. The isocenter in the z-direction is thereby indicated with "zero".

The x-coil shown in FIG. 3 in unwound, two-dimensional representation is clearly not symmetrically wound; the conductor direction varies distinctly and without any symmetry in the z-direction.

In order to minimize or to avoid possible couplings between the x-coil and an associated shim coil due to the dissolution of the z-symmetry, the shim coil that could couple with the x-coil is also asymmetrically wound.

Figure 4:
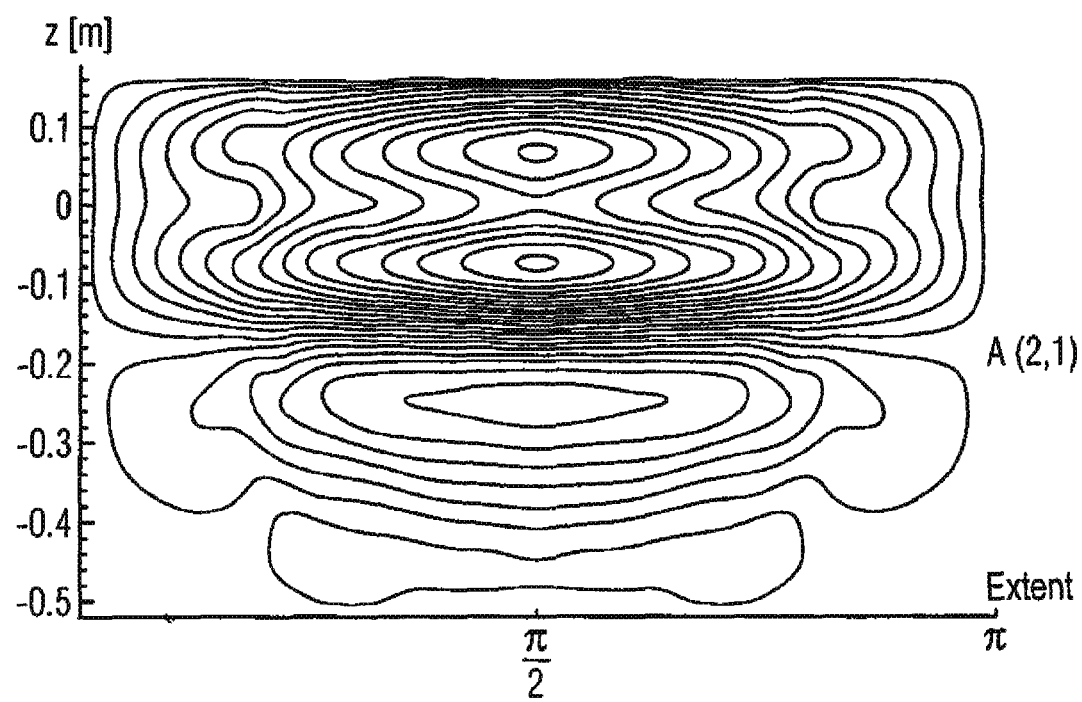
FIG. 4 is a two-dimensional unwound representation of a shim coil corresponding, with regard to the conductor direction, to the x-gradient coil shown in FIG. 3.

FIG. 4 shows an example for this, wherein the conductor pattern is selected under consideration of the conductor pattern of the x-coil from FIG. 3, such that a minimal coupling results. The coil shown in FIG. 4 is the A(2,1)-shim coil that alone can couple with the asymmetrical x-coil from FIG. 3. Of the five field terms of the spherical function expansion of the second order A(2,0), A(2,1), A(2,2), B(2,1) and B(2,2), due to the given symmetry in the x-direction and y-direction only the A(2,1)-shim coil can couple with the x-shim coil. In the case of an asymmetrical y-coil (that is not shown in detail in Figures, but for which the same as stated with regard to the x-coil correspondingly applies), exclusively a coupling with the B(2,1)-shim coil is possible because here as well, as given the x-coil, the peripheral symmetry is preserved.

In each case, the coupling can be minimized via corresponding asymmetrical conductor direction of the shim coil as well, such that the aforementioned difficulties with regard to the loading of the shim amplifier resulting from coupling-induced voltage spikes are in particular reduced or avoided.

Figure 5:
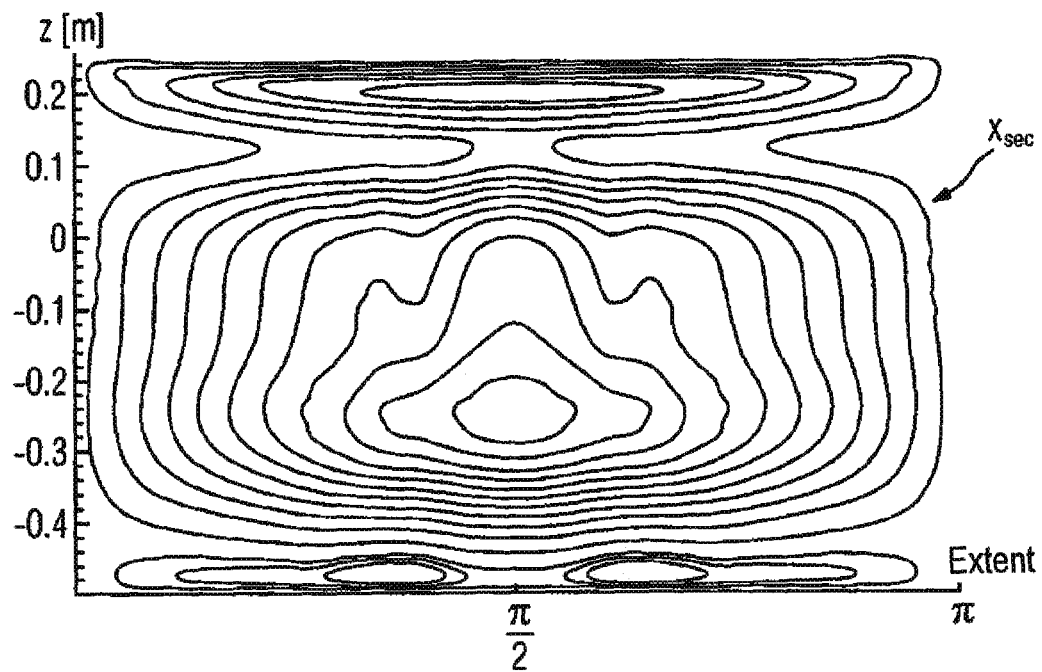
FIG. 5 is a two-dimensional unwound representation of a shielding coil corresponding, with regard to the conductor direction, to the x-gradient coil shown in FIG. 3.

The possibility also exists in a corresponding manner to direct the shielding or secondary coils under consideration of the conductor pattern of the asymmetrical primary coils. FIG. 5 shows an example for a shielding or secondary x-coil. Here as well the asymmetry is clearly in the z-direction while the symmetry in the peripheral direction is maintained, as in the coils according to FIGS. 3 and 4 as well.

Finally, FIG. 6 shows another section through a cylindrical gradient coil that serves for head acquisition and that, for example, can be introduced into a magnetic resonance system as a separate coil. The homogeneity volume generated in the isocenter is shown with the dashed line. The z-axis is plotted for reference purposes. The depressions or broadenings required for accommodation of the shoulder part can be seen on the right side.

Although modifications and changes may be suggested by those skilled in the art, it is the intention of the inventors to embody within the patent warranted heron all changes and modifications as reasonably and properly come within the scope of their contribution to the art.

We claim as our invention:

1. A magnetic resonance apparatus comprising:
   a closed cylindrical basic field magnet that generates a basic magnetic field in an examination volume formed by a bore extending through said basic field magnet, said basic field magnet exhibiting a cylinder axis in the z-direction of an x, y, z Cartesian coordinate system and defining a structural space having a structural space geometry;
   a cylindrical gradient coil arrangement on a cylinder having a cylinder axis concentric with the cylinder axis of the basic field magnet, said cylindrical gradient coil arrangement comprising an x-gradient coil and a y-gradient coil that are each asymmetrical relative to the z-direction, said cylindrical gradient coil arrangement being configured for fitting in said structural space and the asymmetry of the x-gradient coil and asymmetry of the y-gradient coil relative to the z-direction giving said cylindrical gradient coil arrangement an asymmetrical gradient coil geometry; and
   a plurality of shim coils that respectively generate magnetic fields in order to homogenize said basic magnetic field in said examination volume, each shim coil in said plurality of shim coils comprising a shim coil conductor and at least some of said shim coils in said plurality of shim coils being asymmetrical relative to the z-direction in order to minimize a coupling inductance between the asymmetrical x-gradient coil and asymmetrical y-gradient coil and the asymmetrical shim coils, and the shim coil conductor of said at least some of said shim coils being configured, dependent on said asymmetrical gradient coil geometry and said structural space geometry, in order to minimize said coupling inductance between the asymmetrical x-gradient coil and the asymmetrical y-gradient coil and said asymmetrical shim coils.

2. A magnetic resonance apparatus as claimed in claim 1 wherein said plurality of shim coils comprise a first shim coil that generates a magnetic field corresponding to an A(2,1)-field term of a spherical function expansion of the second order, and a second shim coil that generates a magnetic field corresponding to the B(2, 1)-field term of said spherical expansion function of the second order, and wherein only said first and second shim coils are the shim coils that are asymmetrical relative to the z-direction.

3. A magnetic resonance apparatus as claimed in claim 1 wherein said gradient coil arrangement comprises a z-gradient coil, and wherein said magnetic resonance apparatus comprises shielding coils disposed radially outwardly relative to said gradient coil arrangement that shield said asymmetrical x-gradient coil, said asymmetrical y-gradient and said z-gradient coil, said plurality of shim coils being disposed between the shielding coils and the asymmetrical x-gradient coil, the asymmetrical y-gradient coil and the z-gradient coil.

4. A magnetic resonance apparatus as claimed in claim 3 wherein said plurality of shim coils are radially closer to said asymmetrical x-gradient coil, said asymmetrical y-gradient coil and said z-gradient coil than to said shielding coils.

5. A gradient coil arrangement configured for a magnetic resonance apparatus comprising:
   a cylindrical gradient coil assembly comprising an x-gradient coil, a y-gradient and a z-gradient coil in a cylindrical arrangement exhibiting a cylinder axis in the z-direction of an x, y, z Cartesian coordinate system, said x-gradient coil and said y-gradient coil being asymmetrical relative to the z-direction said gradient coil assembly being configured to fit in a closed cylindrical space having a structural space geometry, and the asymmetry of the x-gradient coil and the y-gradient coil relative to the z-direction giving said cylindrical gradient coil assembly an asymmetrical gradient coil geometry;
   shielding coils disposed radially outwardly, relative to said cylinder axis, of said asymmetrical x-gradient coil, said asymmetrical y-gradient coil and said z-gradient coil, that shield the asymmetrical x-gradient coil, the asymmetrical y-gradient coil and the z-gradient coil; and
   a plurality of shim coils disposed radially between said shielding coils and said asymmetrical x-gradient coil, said asymmetrical y-gradient coil and said z-gradient coil, each shim coil in said plurality of shim coils comprising a shim coil conductor and at least some of said plurality of shim coils being asymmetrical relative to the z-direction in order to minimize coupling inductance between the asymmetrical x-gradient coil and asymmetrical y-gradient coil and the asymmetrical shim coils, and the shim coil conductor of said at least some of said plurality of shim coils being configured, dependent on said gradient coil geometry and said structural space geometry, in order to minimize said coupling inductance between the asymmetrical x-gradient coil and the asymmetrical y-gradient coil and said asymmetrical shim coils.

6. A gradient coil arrangement as claimed in claim 5 wherein said plurality of shim coils comprise a first shim coil that generates a magnetic field corresponding to an A(2, 1)-field term of a spherical function expansion of the second order, and a second shim coil that generates a magnetic field corresponding to the B(2, 1)-field term of said spherical expansion function of the second order, and wherein only said first and second shim coils are the shim coils that are asymmetrical relative to the z-direction.

7. A gradient coil arrangement as claimed in claim 5 wherein said shim coils are radially closer to said asymmetrical x-gradient coil, said asymmetrical y-gradient coil and said z-gradient coil than to said shielding coils.

* * * * *